United States Patent [19]
Nolan, III et al.

[11] Patent Number: 5,959,467
[45] Date of Patent: Sep. 28, 1999

[54] HIGH SPEED DYNAMIC DIFFERENTIAL LOGIC CIRCUIT EMPLOYING CAPACITANCE MATCHING DEVICES

[75] Inventors: Joseph G. Nolan, III; John C. Holst; Donald A. Draper, all of San Jose, Calif.

[73] Assignee: Advanced Micro Devices, Inc., Sunnyvale, Calif.

[21] Appl. No.: 08/938,250

[22] Filed: Sep. 26, 1997

Related U.S. Application Data

[60] Provisional application No. 60/027,329, Sep. 30, 1996.

[51] Int. Cl.$^6$ .................................................. H03K 19/177
[52] U.S. Cl. .............................................. 326/39; 326/40
[58] Field of Search ........................................ 326/39, 40

[56] References Cited

U.S. PATENT DOCUMENTS

| | | | |
|---|---|---|---|
| 4,429,238 | 1/1984 | Harrison | 307/465 |
| 4,761,571 | 8/1988 | Golke et al. | 326/31 |
| 4,920,515 | 4/1990 | Obata | 365/185.17 |
| 5,327,379 | 7/1994 | Pascucci | 365/190 |
| 5,563,827 | 10/1996 | Lee et al. | 365/185.23 |
| 5,600,263 | 2/1997 | Trimberger et al. | 326/39 |

*Primary Examiner*—Jon Santamauro
*Assistant Examiner*—Richard Roseen
*Attorney, Agent, or Firm*—Skjerven, Morrill, MacPherson, Franklin & Friel LLP

[57] ABSTRACT

The present invention discloses a differential logic circuit and sensing method providing differential sensing with greater speed and higher density than prior art techniques. One or more input signals are provided to a logic array and two output signals are produced from the logic array wherein one output signal of the logic array is a bit-line and one output signal of the logic array is a bit-bar-line as a reference signal, wherein both signals are provided as input signals to a differential sense amplifier having a binary output signal. The bit-line and the bit-bar-line are precharged to the same voltage level and a controlled input source-grounded transistor having less than fill drive strength is coupled to the bit-bar-line. A source-grounded transistor is coupled to each input signal of the logic array and is programmable to the bit-line by coupling the drain of the source-grounded transistor to the bit-line. A corresponding sourceless transistor, having a gate and a drain, but no source, is coupled to each input signal of the logic array and is programmable to the bit-bar-line by coupling the drain of the sourceless transistor to the bit-bar-line. The source-grounded transistors and the corresponding sourceless transistors are programmed identically providing substantially the same capacitance load on the bit-line and the bit-bar-line.

66 Claims, 4 Drawing Sheets

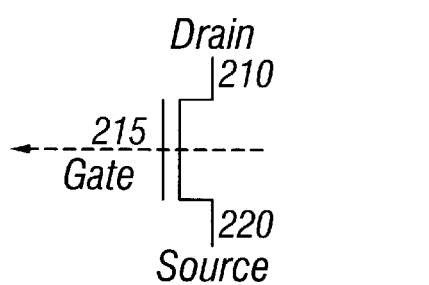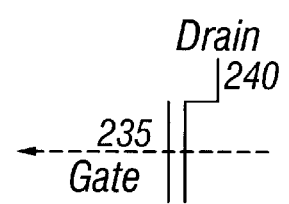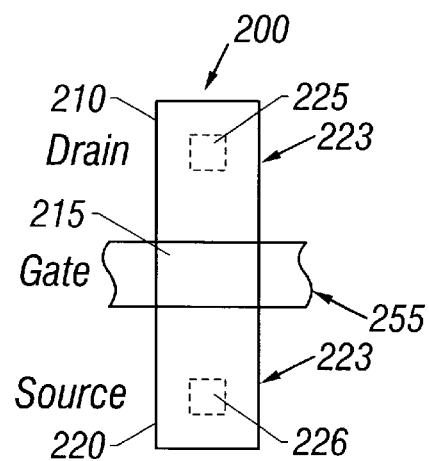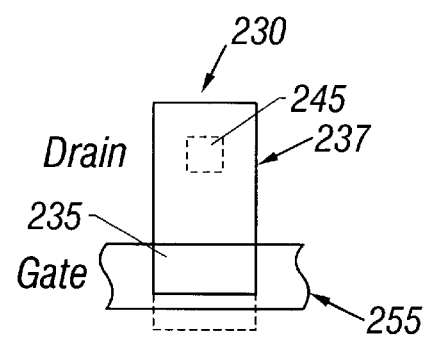
FIG. 3A
FIG. 3B

HIGH SPEED DYNAMIC DIFFERENTIAL LOGIC CIRCUIT EMPLOYING CAPACITANCE MATCHING DEVICES

CROSS-REFERENCE TO RELATED APPLICATION

This application claims the benefit under 35 U.S.C. § 119(e) of U.S. Provisional Application Serial No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

BACKGROUND OF THE INVENTION

1. Field of the Invention

This invention relates to differential logic circuits including logic arrays implementing differential sensing of input signals to produce binary output signals.

2. Description of the Related Art

Differential sensing techniques used in logic circuits process input signals to produce binary output signals, for example, to detect a 1 from a 0 or a high voltage from a low voltage. Differential sensing is employed in microprocessor logic arrays, such as, for example, in both AND array and OR array programmable logic arrays. Prior art techniques of differential sensing have had problems including low density circuit designs requiring too much space for viable circuit manufacturing and/or too slow a speed for efficient use.

Therefore, a differential logic circuit and sensing technique is needed for use in, for example, programmable logic arrays for microprocessors in computer systems, that provide a high density circuit design, ease of fabrication and greater speed.

SUMMARY OF THE INVENTION

The present invention discloses a differential logic circuit and sensing method for processing input signals to produce binary output signals. One or more input signals are provided to a logic array and two output signals are produced from the logic array wherein one output signal of the logic array is a bit-line and one output signal of the logic array is a bit-bar-line as a reference signal. The logic array is, for example, a programmable or a non-programmable logic array, or a Read Only Memory. The bit-line signal and the bit-bar-line signal are provided as input signals to a differential sense amplifier having a binary output signal.

A voltage source is coupled to the bit-line and the bit-bar-line, for example, by a metal oxide field effect transistor (MOSFET), wherein the bit-line and the bit-bar-line are precharged to the same voltage level.

A source-grounded transistor is coupled through the gate to each input signal of the logic array and programmable (contacted or not contacted) to the bit-line by coupling the drain of the source-grounded transistor to the bit-line. A corresponding sourceless transistor is coupled through the gate to each input signal of the logic array and programmable (contacted or not contacted) to the bit-bar-line by coupling the drain of the sourceless transistor to the bit-bar-line. One or more particular source-grounded transistor is programmed when the bit-line output signal of the logic array is to be determined by the input signal of the logic array coupled to the particular source-grounded transistor. The source-grounded transistors and the corresponding sourceless transistors are programmed identically providing substantially the same capacitance load on the bit-line and the bit-bar-line.

A controlled input source-grounded transistor is coupled to the bit-bar-line and has a drive strength less than a drive strength of the source-grounded transistors coupled to the input signals of the logic array. The source-grounded transistors are, for example, N-channel MOSFETs and the sourceless transistors are, for example, N-channel MOSFETs having a gate and a drain and no source connection.

The differential logic circuit and sensing method of the present invention provides a substantially capacitance matched dynamic differential logic circuit having advantages of greater speed, ease of fabrication, and lower density than other methods and circuit designs.

BRIEF DESCRIPTION OF THE DRAWINGS

The present invention may be better understood, and its numerous objects, features, and advantages made apparent to those skilled in the art by referencing the accompanying drawings.

FIGS. 3A and 3B are layout schematics and symbols illustrating fabrication and layout of the memory cells (FIG. 3A) and the sourceless memory cell (FIG. 3B) included in the differential logic circuit of the present invention.

The use of the same reference symbols in different drawings indicates similar or identical items.

DESCRIPTION OF THE PREFERRED EMBODIMENT(S)

Figure 1:
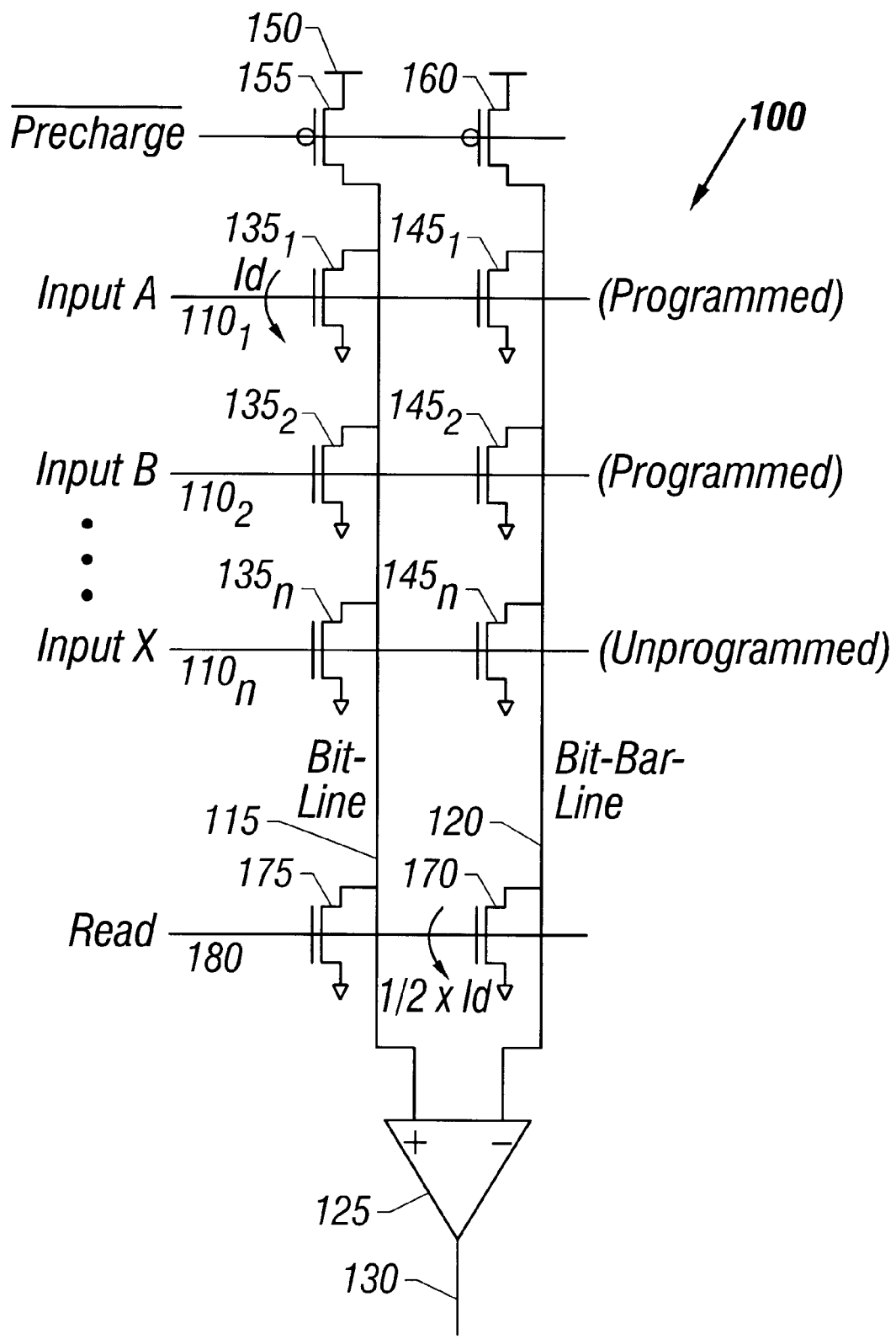
FIG. 1 is a schematic illustrating an embodiment of the differential logic circuit and method for differential sensing according to the present invention wherein substantially the same capacitance load is provided on a bit-line and a bit-bar-line.

Referring now to FIG. 1, the schematic diagram illustrates a differential logic circuit and technique according to the present invention. The differential sensing logic circuit includes a logic array, such as a programmable or non-programmable logic array, as used, for example, in an integrated circuit microprocessor of a computer system. The differential sensing logic circuit processes input signals of the logic array to produce binary output signals.

The present invention discloses one or more input signals $110_1, 110_2, \ldots, 110_n$ provided to the logic array 100 and two output signals produced from the logic array 100 wherein one output signal of the logic array 100 is a bit-line 115 and one output signal of the logic array 100 is a bit-bar-line 120 as a reference signal. The bit-line 115 and the bit-bar-line 120 are input signals to a differential sense amplifier 125 having a binary output signal 402. The logic array 100 is for example, an AND array or an OR array. The input signals $110_1, 110_2, \ldots, 110_n$ to the logic array 100, the bit-line 115 and the bit-bar-line 120, and the differential sense amplifier 125 operate logically as a NOR gate or an OR gate, implementing a type of dynamic and differential NOR logic, depending on the polarity of connections between the differential sense amplifier 125 and the bit-line 115 and the bit-bar-line 120. The differential sense amplifier 125 is strobed when the difference between the signal of the bit-line 115 and the signal of the bit-bar-line 120 is sufficient for reliable operation or, for example, the differential sense amplifier 125 is always enabled.

Memory terminology is used to describe the features and operation in this description because the principles apply to the implementation of a Read Only Memory (ROM) as well as a logic array 100 such as a programmable logic array (PLA). The inputs signals $110_1, 110_2, \ldots, 110_n$ of a logic array 100 correspond to memory word-lines, while the output of a logic array 100 corresponds to a memory bit-line 115, and because the technique is differential, a bit-bar-line 120. For simplicity, the differential logic circuit of the present invention is described in a one bit slice, however, differential logic circuit is replicated for each memory bit-line 115 as necessary. In the PLA implementation, each differential sense amplifier 125 is connected to the bit and complement pair (bit-line 115 and bit-bar-line 120). In the ROM implementation, each bit-line 115 and bit-bar-line 120 might be further decoded (not illustrated) before reaching the differential sense amplifier 125.

A source-grounded transistor $135_1, 135_2, \ldots, 135_n$ is coupled to each input signal $110_1, 110_2, \ldots, 110_n$ of the logic array 100 and is programmable to the bit-line 115. A corresponding sourceless transistor $145_1, 145_2, \ldots, 145_n$ is also coupled to each input signal $110_1, 110_2, \ldots, 110_n$ of the logic array 100 and is programmable to the bit-bar-line 120. The source-grounded transistors $135_1, 135_2, \ldots, 135_n$ and the corresponding sourceless transistors $145_1, 145_2, \ldots, 145_n$ coupled to the input signals $110_1, 110_2, \ldots, 110_n$ of the logic array 100 are programmed identically, rather than complementary, providing substantially the same capacitance load on the bit-line 115 and the bit-bar-line 120.

The gate of each source-grounded transistor $135_1, 135_2, \ldots, 135_n$ is coupled to each input signal $110_1, 110_2, \ldots, 110_n$ of the logic array 100 and is programmed (contacted or not contacted) to the bit-line 115 by coupling the drain of the source-grounded transistors $135_1, 135_2, \ldots, 135_n$ (illustrated in FIG. 1 as source-grounded transistors $135_1$ and $135_2$) to the bit-line 115. The particular source-grounded transistors $135_1$ and $135_2$ are programmed when the bit-line 115 output signal of the logic array 100 is to be determined by the input signals $110_1$ and $110_2$ of the logic array 100 coupled to the particular source-grounded transistors $135_1$ and $135_2$ and reflecting the particular desired logical NOR function thus providing a dynamic differential logic circuit.

The gate of each corresponding sourceless transistor $145_1, 145_2, \ldots, 145_n$ is coupled to each input signal $110_1, 110_2, \ldots, 110_n$ of the logic array 100. The corresponding sourceless transistor $145_1$ and $145_2$, identically programmed to the particular source-grounded transistors $135_1$ and $135_2$, are programmed (contacted or not contacted) to the bit-bar-line 120 by coupling the drain of the corresponding sourceless transistors $145_1$ and $145_2$ to the bit-bar-line 120.

The source-grounded transistors $135_1, 135_2, \ldots, 135_n$ are, for example, N-channel metal oxide semiconductor field-effect transistors (MOSFETs) (a ROM memory cell) and the corresponding sourceless transistors $145_1, 145_2, \ldots, 145_n$ are, for example, N-channel MOSFETs (a ROM memory cell) having a gate and a drain and no source connection. The source-grounded transistors $135_1, 135_2, \ldots, 135_n$ and the corresponding sourceless transistors $145_1, 145_2, \ldots, 145_n$ provide substantially the same capacitive load onto each of the bit-line 115 and the bit-bar-line 120 when programmed (contacted or not contacted) identically. Specifically, each of the source-grounded transistor's $135_1, 135_2, \ldots, 135_n$ drain-to-bulk capacitance and gate-to-drain overlap Miller capacitance, as well as the wiring parasitic capacitances match the corresponding capacitances of the corresponding sourceless transistors $145_1, 145_2, \ldots, 145_n$. Thus, the corresponding sourceless transistors $145_1, 145_2, \ldots, 145_n$ are essentially capacitively matched dummy N-channel MOSFET memory cells with no source.

One hard-wired connection of each bit-line 115 and bit-bar-line 120 is coupled to a voltage source 150 through, for example, a P-channel MOSFET 155 and 160, respectively, wherein the bit-line 115 and the bit-bar-line 120 are precharged to a same voltage level ($V_{DD}$).

A transistor device having a drive strength less than the drive strength of the source-grounded transistors $135_1, 135_2, \ldots, 135_n$ is coupled to the bit-bar-line 120 in order to pulldown less than the full drain current on the bit-bar-line 120 reference signal to efficiently differentiate signal fall rates between the bit-line signal and the bit-bar-line signal. Therefore, a controlled input source-grounded transistor 170, whose drive strength is designed to be less than the drive strength of the source-grounded transistors $135_1, 135_2, \ldots, 135_n$ (shown in FIG. 1 as one half the drive strength), is coupled to the bit-bar-line 120. For example, one hard-wired connection of the bit-bar-line 120 is to the drain of the controlled input source-grounded transistor 170 (an N-channel MOSFET, for example) termed a "Read" device. In another embodiment, one hard-wired connection on the bit-line 115 is also coupled to the drain of a controlled input sourceless transistor 175 (an N-channel MOSFET, for example) also termed a "Read" device, for capacitance matching purposes. The gates of the "Read" devices are both tied to the same "Read" control input 180 as shown in FIG. 1.

After precharging to $V_{DD}$, any or all of the pairs of the source-grounded transistors $135_1, 135_2, \ldots, 135_n$ and the corresponding sourceless transistors $145_1, 145_2, \ldots, 145_n$ may be programmed. If, for example, the input signal $110_1$ of the logic array 100 is active and the pairs of the source-grounded transistor $135_1$ and the corresponding sourceless transistor $145_1$, for example, is programmed, the bit-line 115 is pulled down by the source-grounded transistor $135_1$, while the bit-bar-line 120 cannot be pulled down by the corresponding sourceless transistor $145_1$ and the capacitive loads on the bit-line 115 and the bit-bar-line 120 are substantially the same.

Figure 2A:
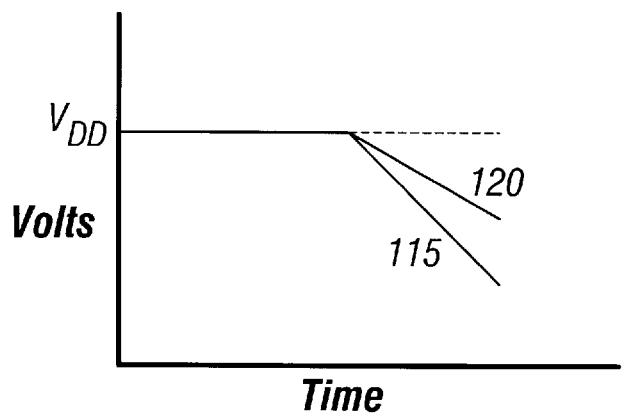
FIGS. 2A through 2C are schematics illustrating slew rates for the bit-line and bit-bar-lines for differing programmed inputs.
Figure 2B:
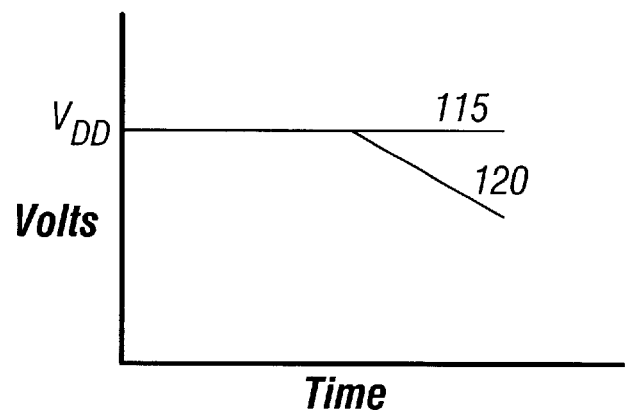
Figure 2C:
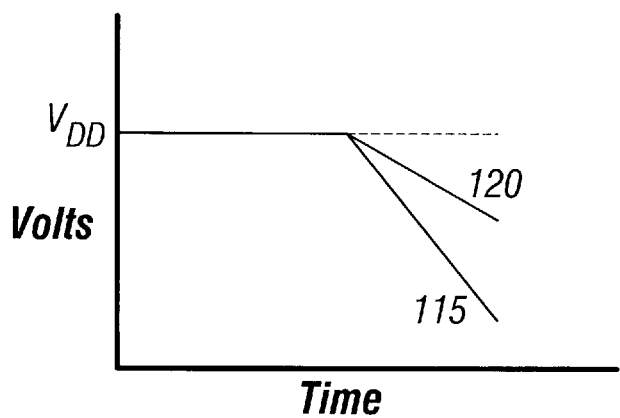

FIGS. 2A through 2C illustrate slew rates (volts/second) for the bit-line and bit-bar-lines for differing programmed inputs. The slew rates, a rate of change of output voltage for an amplifier such as the differential sense amplifier 125, is shown herein as fall rates wherein the precharge voltage $V_{DD}$ is a high level voltage. However, the slew rates may also be, for example, rising rates wherein $V_{DD}$ is set at a different level.

The capacitance loads on the bit-line 115 and the bit-bar-line 120 are substantially the same, as described, and the drive strength of the source-grounded transistor 170 "Read" device is, for example, one half the drive strength of the source-grounded transistors $135_1, 135_2, \ldots, 135_n$. If only one input signal $110_1$, for example, is active and the coupled source-grounded transistor $135_1$ and corresponding sourceless transistor $145_1$ are programmed, the bit-line 115 signal and the bit-bar-line 120 signal both fall, however, they will fall at different rates. In this case, where only one input signal $110_1$ is active, the fall rate of the bit-line 115 signal is twice the fall rate of the bit-bar-line 120 signal, as illustrated in FIG. 2A. If none of the input signals $110_1$, $110_2$, ..., $110_n$ are active or none of the pairs of the source-grounded transistors $135_1$, $135_2$, ..., $135_n$ and corresponding sourceless transistors $145_1$, $145_2$, ..., $145_n$ are programmed, only the bit-bar-line 120 signal falls, as shown in FIG. 2B. When multiple input signals $110_1$ and $110_2$ for example, are active and multiple pairs of the source-grounded transistors $135_1$ and $135_2$ and the corresponding sourceless transistors $145_1$ and $145_2$, respectively, are programmed, the bit-line 115 signal falls faster than twice the bit-bar-line 120 signal, as illustrated in FIG. 2C.

In each case, the voltage difference is sensed by the differential sense amplifier 125 which is, for example, strobed when the voltage difference between the bit-line 115 signal and the bit-bar-line 120 signal is sufficient for reliable operation, and the "1" or "0" resulting output signal 402 is determined. Alternatively, the differential sense amplifier 125 is always enabled and is not strobed.

FIGS. 3A and 3B illustrate fabrication layouts and symbols of the source-grounded transistors and sourceless transistors included in the differential logic circuit of the present invention. FIG. 3A illustrates the fabrication layout and symbol of the source-grounded transistor or memory cell 200 as is fabricated and used in the present invention and also typically used in standard logic circuits. The memory cell 200 is formed, for example, including a gate region 215, and a drain region 210 and a source region 220 located on opposite sides of the gate region 215. The gate region 215 is, for example, a gate polysilicon. A diffusion region 223 is formed underneath and on opposite sides of the gate region 215 and defines the drain region 210 and the source region 220. A contact 225 is formed and coupled from the drain region 210 to a signal line (not shown) when the memory cell 200 is programmed. Another contact 226 is coupled from the source region 220 to a ground line or ground plane (not shown) wherein the memory cell 200 is source-grounded.

In FIG. 3B, the sourceless transistor or sourceless memory cell 230, as used in accordance with the present invention, is illustrated. The sourceless memory cell 230 is formed, for example, including a gate region 235, for example, a gate polysilicon. The gate region 215 of the memory cell 200 and the gate region 235 of the sourceless memory cell 230, for example, share a gate polysilicon section 255 for ease of fabrication. The sourceless memory cell 230 is formed also including a drain region 240. A contact 245 is coupled from the drain region 240 to a signal line (not shown) when the sourceless memory cell 230 is programmed.

In the preferred embodiment, a diffusion region 237 is formed partially underneath the gate region 235 and on one side of the gate region 235 defining the drain region 240. However, as shown in FIG. 3B, the sourceless memory cell 230 has no source region. The diffusion region 237 of the sourceless memory cell 230, preferably, forms an incomplete channel wherein the diffusion region 237 emerges from under the gate region 235 only on the side defining the drain region 240. Although the diffusion region 237 is illustrated in FIG. 3B as approximately three-quarters formed underneath the gate region 235, the diffusion region 237 may be formed to any optimal size underneath the gate region 235.

As shown in FIGS. 3A and 3B, the sourceless memory cell 230 is fabricated to substantially the same size area as the memory cell 200, and shares, for example, a common gate polysilicon 255, allowing for a dense layout design of the differential logic circuit. Because the layout sizes are the same, the memory cell 200 and the sourceless memory cell 230 have substantially the same gate region 215 to drain region 210 overlap capacitance, substantially the same drain region 210 to bulk capacitance, and substantially the same wiring and contact parasitic capacitance (when the memory cells 200 and the sourceless memory cells 230 are programmed identically to the signal lines), the bit-line 115 and the bit-bar-line 120 have substantially the same capacitve loads. However, the sourceless memory cells 230 (having no source) do not create a current path that would discharge the bit-bar-line 120 reference signal. The design allows for a dense layout with out additional fabrication steps and efficient differential sensing of signals.

In an alternate embodiment, the diffusion region 237 could be extended (as indicated by the dotted lines of FIG. 3B) to complete the channel. However, due to process circuit design requirements, this embodiment would require additional layout space and would not be as dense a layout design as the preferred embodiment.

Programming of the memory cell 200 and the sourceless memory cell 230 (corresponding to the source-grounded transistors and sourceless transistors, respectively, as described in FIG. 1) in accordance with the apparatus and method of the present invention, is implemented, for example, through the inclusion or exclusion of the contacts illustrated in FIGS. 3A and 3B, which sacrifices some access time and layout size in fabrication and manufacturing, but allows for code changes later in the manufacturing process. Alternatively, diffusion programming may be used as manufacturing technique for programming of the memory cell 200 and the sourceless memory cell 230, instead of using the contacts as illustrated in FIGS. 3A and 3B.

The source-grounded transistors $135_1$, $135_2$, ..., $135_n$ coupled to the input signal lines as shown in FIG. 1, are fabricated as shown in FIG. 3A, the memory cell 200 layout. The source-grounded transistors $135_1$, $135_2$, ..., $135_n$ (or memory cells 200) are programmed by forming contacts 225 coupling the drain region 210 of the memory cells 200 to a signal line (the bit-line 115 of FIG. 1). As described in FIG. 1, the particular source-grounded transistors $135_1$, $135_2$, ..., $135_n$ are programmed when a bit-line output signal of the logic array is to be determined by the input signals of the logic array coupled to the particular source-grounded transistors $135_1$, $135_2$, ..., $135_n$. The corresponding sourceless transistors $145_1$, $145_2$, ..., $145_n$, respectively, coupled to the input signal lines shown in FIG. 1, are fabricated as shown in FIG. 3B, the sourceless memory cell 230 layout. The corresponding sourceless transistors $145_1$, $145_2$, ..., $145_n$, (or sourceless memory cells 230) are programmed identically corresponding to the source-grounded transistors $135_1$, $135_2$, ..., $135_n$, respectively. The corresponding sourceless transistors $145_1$, $145_2$, ..., $145_n$, (or sourceless memory cells 230) are programmed by forming contacts 245 coupling the drain region 240 of the corresponding sourceless memory cells 230 to a signal line (the bit-bar-line 120 of FIG. 1). The memory cells 200 and sourceless memory cells 230 are programmed by the presence or absence of the contacts coupled to the signal lines. If not programmed or coupled to the signal lines, the memory cells 200 and sourceless memory cells 230 are still physically present in the fabricated layout, however, there is no connection to a signal line from the drain regions.

The differential logic circuit and method for differential sensing of the present invention can be used in variety of circuits and devices incorporating semiconductor memory.

Figure 4:
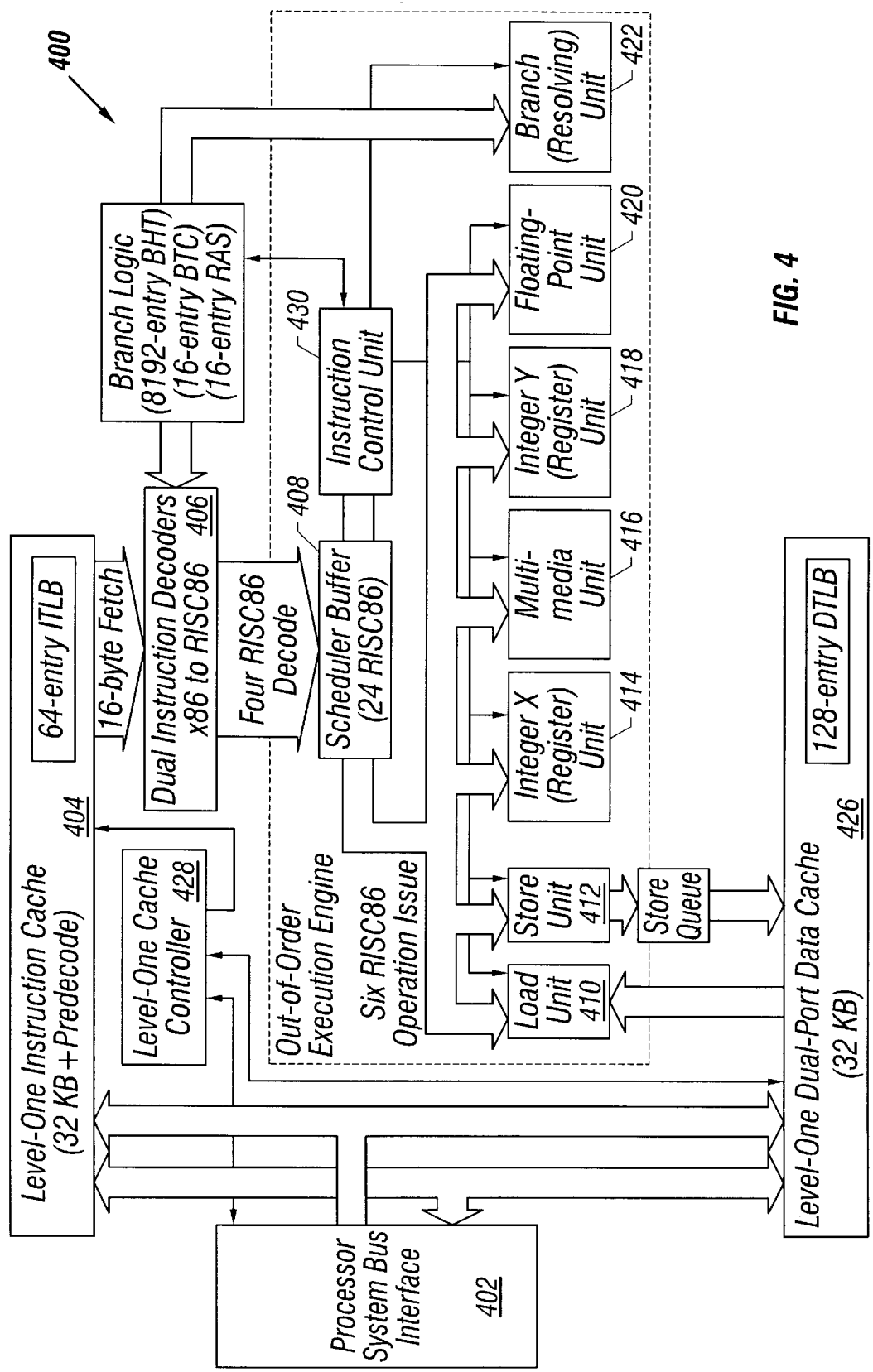
FIG. 4 is a block schematic illustrating an integrated circuit employing the differential logic circuit of the present invention.

For example, FIG. 4 depicts an exemplary x86 instruction-set compatible integrated circuit microprocessor 400. Instructions obtained from a processor system bus interface 402 are pre-decoded during filling of a level-one (L1) instruction cache 404. Integrated circuit microprocessor 400 decodes up to two x86 instructions per clock from instruction cache 404. Most of the x86 instructions are directly translated by hardware of dual instruction decoders 406 into one to four RISC-like operations, called RISC86 Ops. Other complex or uncommon instructions are mapped into ROM-resident sequences of RISC Ops using emulation code ROM translation. An instruction scheduler 408 buffers up to 24 RISC86 operations, using register renaming with a total of 48 registers. Up to six RISC86 instructions are issued out-of-order to seven parallel execution units, illustratively load unit 410, store unit 412, integer X unit 414, multimedia unit 416, integer Y unit 418, floating point unit 420, and branch unit 422. RISC86 instructions are speculatively executed and retired in order. Microprocessor 400 also includes level-one (L1) dual-port data cache 426.

A level-one cache controller 428 controls caching in instruction cache 404. Instruction cache 404 uses a most recently used scheme (MRU) to predict the way selection on cache accesses. A misprediction in the way selection causes a one cycle penalty. Instruction cache 404 uses a least recently used (LRU) line replacement algorithm. An alternative random replacement algorithm is supported through a configuration bit. Instruction cache 404 also supports a direct-mapped replacement algorithm, although using the configuration reduces the cache size from 32 KB to 16 KB. Instruction cache 404 performs a simple prefetching algorithm. When a line miss occurs, as distinguished from a sub-block miss, and the miss is on sub-block 0 of the line (bit [5] of the address is 0), then both sub-blocks are fetched and pipelined on the bus.

The data cache 426 includes a 128-entry data translation lookahead buffer (DTLB). In contrast to instruction cache 404, the data cache 426 uses a least recently missed (LRM) selection technique which is generally a more accurate selection scheme than the LRU technique. In the LRM scheme, the line that first enters the cache is replaced. An alternative random replacement algorithm is also supported. The data cache 426 also supports a direct-mapped replacement algorithm, reducing the cache size from 32 KB to 16 KB.

The RISC86 Op scheduler 408, under control of an instruction control unit 430, issues up to six RISC86 operations using out-of-order issuing to seven parallel execution units. The execution units speculatively execute the RISC86 Ops to generate results. The RISC86 Op scheduler 408 retires the results in order. Branch unit 422 implements a branch prediction operation that uses two-level branch prediction based on an 8192-entry branch history table (BHT), a 16-entry branch target cache (BTC), and a 16-entry return address stack (RAS).

The dual instruction decoders 406 translate x86 instructions on-the-fly into corresponding RISC86 Ops. The RISC86 Ops are executed by an instruction core that is essentially a RISC superscalar processing or execution engine. The fetch logic fetches up to sixteen instruction bytes each cycle from instruction cache 404 and transfers the instruction bytes into an instruction buffer (not shown) preceding the dual instruction decoders 406 so that the instruction buffer is maintained at capacity. The dual instruction decoders 406 access the instruction bytes from the instruction buffer, decode up to two x86 instructions, immediately recognize and predict branches, and generate up to four RISC86 Ops. The RISC86 Ops are loaded into the unified RISC86 Op scheduler 408. The RISC86 Op scheduler 408 controls and tracks multiple aspects of RISC86 Op issue and execution.

The load unit 410 loads data via data cache 426 which receives data from an external memory (not shown) via the processor system bus interface 402. Bypass (not shown) and storage buffers (not shown) for data (4×16) to the data cache 426 are supplied to allow data-in and data flow-back to cache output terminals.

A wide variety of computer system configurations are envisioned, each embodying the above-described differential logic circuit and method for differential sensing in accordance with the present invention. For example, one such computer system includes integrated circuit microprocessor 400 with instruction, data and predecode caches having register based redundancy circuits for built-in self-repair in accordance with the present invention, a memory subsystem (e.g., RAM), a display adapter, disk controller/adapter, various input/output interfaces and adapters, and corresponding external devices. Memory, adapters and interfaces are conventionally coupled to integrated circuit microprocessor 400 (e.g., via busses).

The fabrication methods of the differential logic circuit of the present invention does not require any significant additions to a typical manufacturing process. The apparatus and method of the present invention provides a simple capacitive matching of the signal lines of a differential logic circuit with a dense circuit design layout and a method for differential sensing of signals at a relatively greater speed than prior art methods.

While the invention has been described with reference to various embodiments, it will be understood that these embodiments are illustrative and that the scope of the invention is not limited to them. Many variations, modifications, additions and improvements of the embodiments described are possible. For example, the disclosed method and design may be used on any type of electronic equipment using logic circuits where differential sensing is desirable.

What is claimed is:

1. A differential logic circuit for processing input signals of a logic array to produce binary output signals comprising:

one or more input signals to the logic array;

two output signals from the logic array wherein one output signal of the logic array is a bit-line and one output signal of the logic array is a bit-bar-line as a reference signal;

a differential sense amplifier having a binary output signal and wherein the bit-line and the bit-bar-line are input signals to the differential sense amplifier;

a voltage source coupled to the bit-line and the bit-bar-line wherein the bit-line and the bit-bar-line are precharged to the same voltage level;

a source-grounded transistor coupled to each input signal of the logic array and programmable to the bit-line and a corresponding sourceless transistor coupled to each input signal of the logic array and programmable to the bit-bar-line, wherein the source-grounded transistors and the corresponding sourceless transistors coupled to the input signals of the logic array are programmed identically providing substantially the same capacitance load on the bit-line and the bit-bar-line; and a controlled input source-grounded transistor coupled to the bit-bar-line and having a drive strength less than a drive strength of the source-grounded transistor coupled to the input signal of the logic array.

2. A differential logic circuit, as recited in claim 1, wherein the logic array is a programmable logic array.

3. A differential logic circuit, as recited in claim 1, wherein the logic array is a non-programmable logic array.

4. A differential logic circuit, as recited in claim 1, wherein the input signals to the logic array, the bit-line and the bit-bar-line, and the differential sense amplifier operate logically as a NOR gate.

5. A differential logic circuit, as recited in claim 1, wherein the input signals to the logic array, the bit-line and the bit-bar-line, and the differential sense amplifier operate logically as an OR gate.

6. A differential logic circuit, as recited in claim 1, further comprising:
   a controlled input sourceless transistor coupled to the bit-line wherein the
      controlled input sourceless transistor and the controlled input source-grounded transistor have the same controlled input coupled through the gate of each of said transistors.

7. A differential logic circuit, as recited in claim 1, wherein the source-grounded transistors are N-channel metal oxide semiconductor field-effect transistors.

8. A differential logic circuit, as recited in claim 1, wherein the sourceless transistors are N-channel metal oxide semiconductor field-effect transistors having a gate and a drain and no source connection.

9. A differential logic circuit, as recited in claim 1, wherein each source-grounded transistor and corresponding sourceless transistor coupled to each input signal of the logic array is coupled to said input signal through the gate of said source-grounded transistor and corresponding sourceless transistor.

10. A differential logic circuit, as recited in claim 9, wherein the source-grounded transistors coupled to the input signals of the logic array are programmed to the bit-line by coupling the drain of the source-grounded transistor to the bit-line and wherein one or more particular source-grounded transistor is programmed when the bit-line output signal of the logic array is to be determined by the input signal of the logic array coupled to the particular source-grounded transistor.

11. A differential logic circuit, as recited in claim 10, wherein one or more of the corresponding sourceless transistors coupled to the input signals of the logic array is programmed to the bit-bar-line by coupling the drain of the sourceless transistor to the bit-bar-line and wherein the source-grounded transistors and corresponding sourceless transistors coupled to the input signals of the logic array are programmed identically.

12. A differential logic circuit, as recited in claim 1, wherein a slew rate of the signal of the bit-line is twice a slew rate of the signal of the bit-bar-line when one source-grounded transistor and one corresponding sourceless transistor coupled to one active input signal of the logic array is programmed.

13. A differential logic circuit, as recited in claim 1, wherein a slew rate of the signal of the bit-line is more than twice a slew rate of the signal of the bit-bar-line when multiple source-grounded transistors and corresponding sourceless transistors coupled to multiple active input signals of the logic array are programmed.

14. A differential logic circuit, as recited in claim 1, wherein the signal of the bit-bar-line changes and the signal of the bit-line does not change when the source-grounded transistors and the corresponding sourceless transistors coupled to the input signals of the logic array are not programmed.

15. A differential logic circuit, as recited in claim 1, wherein the voltage source is coupled to the bit-line through a metal oxide semiconductor field-effect transistor and to the bit-bar-line through a metal oxide semiconductor field-effect transistor.

16. A differential logic circuit, as recited in claim 1, wherein the differential sense amplifier is strobed when the difference between the signal of the bit-line and the signal of the bit-bar-line is sufficient for reliable operation.

17. A differential logic circuit, as recited in claim 1, wherein the differential sense amplifier is always enabled.

18. A differential logic circuit, as recited in claim 1, wherein the logic array is a Read Only Memory ("ROM") and the input signals to the ROM are wordlines.

19. An apparatus including a programmable logic array ("PLA") for differential sensing of input signals of the PLA to produce binary output signals comprising:
   one or more input signals to the PLA and two output signals from the PLA wherein one output signal of the PLA is a bit-line and another output signal of the PLA is a bit-bar-line as a reference signal and wherein the bit-line and the bit-bar-line are input signals to a differential sense amplifier having a binary output signal and wherein the input signals, the bit-line, the bit-bar-line, and the differential sense amplifier operate logically as a NOR gate;
   a voltage source coupled to the bit-line and the bit-bar-line wherein the bit-line and the bit-bar-line are precharged to the same voltage level;
   a source-grounded transistor coupled to each input signal of the PLA through the gate of the source-grounded transistor and programmable to the bit-line by coupling the drain of the source-grounded transistor to the bit-line wherein one or more particular source-grounded transistor is programmed when the bit-line output signal of the PLA is to be determined by the input signal of the PLA coupled to the particular source-grounded transistor;
   a sourceless transistor coupled to each input signal of the PLA through the gate of the sourceless transistor and corresponding to the source-grounded transistor coupled to each input signal of the PLA and wherein the corresponding sourceless transistor is programmable to the bit-bar-line by coupling the drain of the corresponding sourceless transistors to the bit-bar-line and wherein the corresponding sourceless transistors are programmed identically to the source-grounded transistors coupled to the input signals of the PLA; and
      wherein programming the source-grounded transistors and the corresponding sourceless transistors identically provides substantially the same capacitance load on the bit-line and the bit-bar-line; and
   a controlled input source-grounded transistor coupled to the bit-bar-line through the drain and having a drive strength less than a drive strength of the source-grounded transistor coupled to each input signal of the PLA.

20. An apparatus, as recited in claim 19, further comprising:
   a controlled input sourceless transistor coupled to the bit-line through the drain and having a same controlled input as the source-grounded transistor coupled to the bit-bar-line.

21. An apparatus, as recited in claim 19, wherein the source-grounded transistors are N-channel metal oxide semiconductor field-effect transistors.

22. An apparatus, as recited in claim 19, wherein the sourceless transistors are N-channel metal oxide semiconductor field-effect transistors having a gate and a drain and no source connection.

23. An apparatus, as recited in claim 19, wherein the voltage source is coupled to the bit-line through a metal oxide semiconductor field-effect transistor and to the bit-bar-line through a metal oxide semiconductor field-effect transistor.

24. An apparatus, as recited in claim 19, wherein the differential sense amplifier is strobed when the difference between the signal of the bit-line and the signal of the bit-bar-line is sufficient for reliable operation.

25. An apparatus, as recited in claim 19, wherein the differential sense amplifier is always enabled.

26. An apparatus, as recited in claim 19, wherein the PLA is a Read Only Memory ("ROM") and the input signals to the ROM are wordlines.

27. A method for differential sensing of input signals of a logic array to produce binary output signals comprising the steps of:

provijding one or more input signals to the logic array;

producing two output signals from the logic array wherein one output signal of the logic array is a bit-line and one output signal of the logic array is a bit-bar-line as a reference signal;

providing the bit-line and the bit-bar-line as input signals to a differential sense amplifier having a binary output signal;

precharging the bit-line and the bit-bar-line to the same voltage level;

coupling a source-grounded transistor to each input signal of the logic array and a corresponding sourceless transistor to each input signal of the logic array; and wherein the source-grounded transistors are programmable to the bit-line and the corresponding sourceless transistors are programmable to the bit-bar-line and wherein the source-grounded transistors and the corresponding sourceless transistors are programmed identically providing substantially the same capacitance load on the bit-line and the bit-bar-line; and coupling, to the bit-bar-line, a controlled input source-grounded transistor having a drive strength less than the drive strength of the source-grounded transistor coupled to each input signal of the logic array.

28. A method for differential sensing, as recited in claim 27, wherein the logic array is a programmable logic array.

29. A method for differential sensing, as recited in claim 27, wherein the logic array is a non-programmable logic array.

30. A method for differential sensing, as recited in claim 27, further comprising the step of:

operating the input signals to the logic array, the bit-line and the bit-bar-line, and the differential sense amplifier logically as a NOR gate.

31. A method for differential sensing, as recited in claim 27, further comprising the step of:

operating the input signals to the logic array, the bit-line and the bit-bar-line, and the differential sense amplifier logically as an OR gate.

32. A method for differential sensing, as recited in claim 27, further comprising the step of:

coupling a controlled input sourceless transistor to the bit-line wherein a same the controlled input is provided to the controlled input sourceless transistor and is coupled through the gate of each of said transistors.

33. A method for differential sensing, as recited in claim 27, wherein each source-grounded transistor and each corresponding sourceless transistor coupled to each input signal of the logic array is coupled to said input signals through the gate of said source-grounded transistor and said corresponding sourceless transistor.

34. A method for differential sensing, as recited in claim 33, wherein the source-grounded transistors coupled to the input signals of the logic array are programmed to the bit-line by coupling the drain of the source-grounded transistor to the bit-line and wherein one or more particular source-grounded transistor is programmed when the bit-line output signal of the logic array is to be determined by the input signal of the logic array coupled to the particular source-grounded transistor and wherein the corresponding sourceless transistors coupled to the input signals of the logic array are programmed to the bit-bar-line by coupling the drain of the sourceless transistor to the bit-bar-line.

35. A method for differential sensing, as recited in claim 34, wherein a slew rate of the signal of the bit-line is twice a slew rate of the signal of the bit-bar-line when one pair of the source-grounded transistor and the corresponding sourceless transistor coupled to one active input signal of the logic array is programmed.

36. A method for differential sensing, as recited in claim 34, wherein a slew rate of the signal of the bit-line is more than twice a slew rate of the signal of the bit-bar-line when multiple pairs of source-grounded transistors and corresponding sourceless transistors coupled to multiple active input signals of the logic array are programmed.

37. A method for differential sensing, as recited in claim 34, wherein the signal of the bit-bar-line changes and the signal of the bit-line does not change when the source-grounded transistors and the corresponding sourceless transistors coupled to the input signals of the logic array are not programmed.

38. A method for differential sensing, as recited in claim 27, wherein the source-grounded transistors are N-channel metal oxide semiconductor field-effect transistors.

39. A method for differential sensing, as recited in claim 27, wherein the sourceless transistors are N-channel metal oxide semiconductor field-effect transistors having a gate and a drain and no source connection.

40. A method for differential sensing, as recited in claim 27, wherein the step of precharging the bit-line and the bit-bar-line to the same voltage level further comprises the step of:

coupling a voltage source to the bit-line through a metal oxide semiconductor field-effect transistor and to the bit-bar-line through a metal oxide semiconductor field-effect transistor.

41. A method for differential sensing, as recited in claim 27, wherein the differential sense amplifier is strobed when the difference between the signal of the bit-line and the signal of the bit-bar-line is sufficient for reliable operation.

42. A method for differential sensing, as recited in claim 27, wherein the differential sense amplifier is always enabled.

43. A method for differential sensing, as recited in claim 27, wherein the logic array is a Read Only Memory ("ROM") and the input signals to the ROM are wordlines.

44. A method of fabricating a semiconductor device for differential sensing of input signals to produce a binary output signal, the method comprising the steps of:

forming a logic array including one or more input signal lines to the logic array and two output signal lines from the logic array wherein one output signal line is a bit-line and one output signal line is a bit-bar-line as a reference signal line;

providing a differential sense amplifier having an binary output signal line and wherein the bit-line and the bit-bar-line are input signal lines to the differential sense amplifier;

coupling a voltage source to the bit-line and the bit-bar-line for providing a precharged voltage level to the bit-line and the bit-bar-line;

forming a memory cell for each input signal line of the logic array and programmable to the bit-line, said memory cell having a gate region coupled to said input signal line, a drain region, and a source region coupled to ground wherein the drain region and the source region are located on opposite sides of the gate region; and wherein a diffusion region is formed underneath and on opposite sides of the gate region defining the drain region and the source region; and forming a sourceless memory cell for each input signal line of the logic array and programmable to the bit-bar-line, wherein the memory cells and the sourceless memory cells form corresponding pairs on said input signal lines, said sourceless memory cell having a gate region coupled to said input signal line and a drain region; and wherein a diffusion region is formed partially underneath the gate region and on one side of the gate region, defining the drain region;

wherein the corresponding pairs of the memory cells and the sourceless memory cells coupled to said input signal lines are programmed identically providing substantially the same capacitance load on the bit-line and the bit-bar-line; and forming a controlled input memory cell having a drive strength less than the drive strength of the memory cell coupled to each input signal line of the logic array, and having a gate region coupled to a controlled input signal line, a drain region coupled to the bit-bar-line and a source region coupled to ground.

45. A method, as recited in claim 44, wherein the logic array is a programmable logic array.

46. A method, as recited in claim 44, wherein the logic array is a non-programmable logic array.

47. A method, as recited in claim 44, further comprising the steps of:

programming the memory cells coupled to said input signal lines by forming contacts coupling the drain region of the memory cell to the bit-line wherein one or more particular memory cell is programmed when the bit-line output signal of the logic array is to be determined by the input signal of the logic array coupled to the particular memory cell; and programming the corresponding sourceless memory cells coupled to said input signal lines by forming contacts coupling the drain region of the corresponding sourceless memory cell to the bit-bar-line.

48. A method, as recited in claim 44, further comprising the step of:

forming a controlled input sourceless memory cell having a gate region coupled to the controlled input signal line and a drain region coupled to the bit-line; and wherein a diffusion region is formed partially underneath and on one side of the gate region, defining the drain region.

49. A method, as recited in claim 44, wherein the memory cells are N-channel metal oxide semiconductor field-effect transistors.

50. A method, as recited in claim 44, wherein the sourceless memory cells are N-channel metal oxide semiconductor field-effect transistors having a gate region and a drain region and no source region.

51. A method, as recited in claim 44, wherein the gate regions of the corresponding pairs of the memory cells and the sourceless memory cells include a shared gate polysilicon.

52. A method, as recited in claim 44, further comprising the step of:

coupling the voltage source to the bit-line through a metal oxide semiconductor field-effect transistor and to the bit-bar-line through a metal oxide semiconductor field-effect transistor.

53. A method, as recited in claim 44, further comprising the step of:

further forming the diffusion region of the sourceless memory cell beyond the gate region on the side of the gate region opposite to the drain region.

54. A method, as recited in claim 44, wherein the logic array is a Read Only Memory ("ROM") and the input signal lines are wordlines.

55. An integrated circuit chip including a differential logic circuit for processing input signals of a logic array to produce binary output signals comprising:

one or more input signals to the logic array;

two output signals from the logic array wherein one output signal of the logic array is a bit-line and one output signal of the logic array is a bit-bar-line as a reference signal;

a differential sense amplifier having a binary output signal and wherein the bit-line and the bit-bar-line are input signals to the differential sense amplifier;

a voltage source coupled to the bit-line and the bit-bar-line wherein the bit-line and the bit-bar-line are precharged to the same voltage level;

a source-grounded transistor coupled to each input signal of the logic array and programmable to the bit-line and a corresponding sourceless transistor coupled to each input signal of the logic array and programmable to the bit-bar-line, wherein the source-grounded transistors and the corresponding sourceless transistors coupled to the input signals of the logic array are programmed identically providing substantially the same capacitance load on the bit-line and the bit-bar-line; and a controlled input source-grounded transistor coupled to the bit-bar-line and having a drive strength less than a drive strength of the source-grounded transistor coupled to the input signal of the logic array.

56. An integrated circuit chip, as recited in claim 55, further comprising:

a controlled input sourceless transistor coupled to the bit-line wherein the controlled input sourceless transistor and the controlled input source-grounded transistor have the same controlled input coupled through the gate of each of said transistors.

57. An integrated circuit chip, as recited in claim 55, wherein the source-grounded transistors are N-channel metal oxide semiconductor field-effect transistors.

58. An integrated circuit chip, as recited in claim 55, wherein the sourceless transistors are N-channel metal oxide semiconductor field-effect transistors having a gate and a drain and no source connection.

59. An integrated circuit chip, as recited in claim 55, wherein each source-grounded transistor and corresponding sourceless transistor coupled to each input signal of the logic array is coupled to said input signal through the gate of said source-grounded transistor and corresponding sourceless transistor.

60. An integrated circuit chip, as recited in claim 59, wherein the source-grounded transistors coupled to the input signals of the logic array are programmed to the bit-line by coupling the drain of the source-grounded transistor to the bit-line and wherein one or more particular source-grounded transistor is programmed when the bit-line output signal of the logic array is to be determined by the input signal of the logic array coupled to the particular source-grounded transistor.

61. An integrated circuit chip, as recited in claim 60, wherein one or more of the corresponding sourceless transistors coupled to the input signals of the logic array is programmed to the bit-bar-line by coupling the drain of the sourceless transistor to the bit-bar-line and wherein the source-grounded transistors and corresponding sourceless transistors coupled to the input signals of the logic array are programmed identically.

62. An integrated circuit chip, as recited in claim 55, wherein a slew rate of the signal of the bit-line is twice a slew rate of the signal of the bit-bar-line when one source-grounded transistor and one corresponding sourceless transistor coupled to one active input signal of the logic array is programmed.

63. An integrated circuit chip, as recited in claim 55, wherein a slew rate of the signal of the bit-line is more than twice a slew rate of the signal of the bit-bar-line when multiple source-grounded transistors and corresponding sourceless transistors coupled to multiple active input signals of the logic array are programmed.

64. An integrated circuit chip, as recited in claim 55, wherein the signal of the bit-bar-line changes and the signal of the bit-line does not change when the source-grounded transistors and the corresponding sourceless transistors coupled to the input signals of the logic array are not programmed.

65. An integrated circuit chip, as recited in claim 55, wherein the voltage source is coupled to the bit-line through a metal oxide semiconductor field-effect transistor and to the bit-bar-line through a metal oxide semiconductor field-effect transistor.

66. An integrated circuit chip, as recited in claim 55, wherein the logic array is a Read Only Memory ("ROM") and the input signals to the ROM are wordlines.

* * * * *